(12) United States Patent
Mawst et al.

(10) Patent No.: US 7,457,338 B2
(45) Date of Patent: Nov. 25, 2008

(54) QUANTUM WELL LASERS WITH STRAINED QUANTUM WELLS AND DILUTE NITRIDE BARRIERS

(75) Inventors: Luke J. Mawst, Sun Prairie, WI (US); Nelson Tansu, Bethlehem, PA (US); Jeng-Ya Yeh, Portland, OR (US)

(73) Assignee: Wisconsin Alumni Research Foundation, Madison, WI (US)

( * ) Notice: Subject to any disclaimer, the term of this patent is extended or adjusted under 35 U.S.C. 154(b) by 55 days.

(21) Appl. No.: 11/406,834

(22) Filed: Apr. 19, 2006

(65) Prior Publication Data

US 2007/0248135 A1    Oct. 25, 2007

(51) Int. Cl.
*H01S 3/04* (2006.01)

(52) U.S. Cl. .............................. 372/43.01; 372/45.011; 372/96

(58) Field of Classification Search ............... 372/43.01
See application file for complete search history.

(56) References Cited

U.S. PATENT DOCUMENTS

| | | | |
|---|---|---|---|
| 4,023,993 A | 5/1977 | Scifres et al. | |
| 4,257,011 A * | 3/1981 | Nakamura et al. | 372/46.012 |
| 4,745,607 A | 5/1988 | Koch | |
| 4,796,274 A | 1/1989 | Akiba et al. | |
| 4,817,110 A | 3/1989 | Tokuda et al. | |
| 4,847,844 A | 7/1989 | Noda et al. | |
| 4,860,298 A | 8/1989 | Botez et al. | |
| 4,894,835 A | 1/1990 | Uomi et al. | |
| 4,958,357 A | 9/1990 | Kinoshita | |
| 4,975,923 A | 12/1990 | Buus et al. | |
| 4,985,897 A | 1/1991 | Botez et al. | |
| 5,036,522 A | 7/1991 | Tanguy et al. | |
| 5,052,016 A | 9/1991 | Mahbobzadeh et al. | |
| 5,086,430 A | 2/1992 | Kapon et al. | |
| 5,101,413 A | 3/1992 | Botez | |
| 5,159,604 A | 10/1992 | Mehuys et al. | |
| 5,170,405 A | 12/1992 | Connolly et al. | |
| 5,208,824 A | 5/1993 | Tsang | |
| 5,222,090 A | 6/1993 | Serreze | |
| 5,241,556 A | 8/1993 | Macomber et al. | |
| 5,255,278 A | 10/1993 | Yamanaka | |
| 5,263,041 A | 11/1993 | Pankove | |
| 5,272,711 A | 12/1993 | Mawst et al. | |
| 5,272,714 A | 12/1993 | Chen et al. | |

(Continued)

FOREIGN PATENT DOCUMENTS

WO     WO 96/08062     3/1996

(Continued)

OTHER PUBLICATIONS

U.S. Appl. No. 11/276,712, filed Mar. 10, 2006, Botez et al.

(Continued)

*Primary Examiner*—Minsun Harvey
*Assistant Examiner*—Xnning Niu
(74) *Attorney, Agent, or Firm*—Foley & Lardner LLP (57) ABSTRACT

In accordance with the present invention, GaAs-based optoelectronic devices have an active region that includes a well layer composed of a compressively-strained semiconductor that is free, or substantially free, of nitrogen disposed between two barrier layers composed of a nitrogen- and indium-containing semiconductor.

20 Claims, 7 Drawing Sheets

U.S. PATENT DOCUMENTS

| | | | |
|---|---|---|---|
| 5,295,150 A | 3/1994 | Vangieson et al. | |
| 5,323,405 A | 6/1994 | Kamiyama et al. | |
| 5,329,542 A | 7/1994 | Westbrook | |
| 5,345,466 A | 9/1994 | Macomber | |
| 5,347,533 A | 9/1994 | Higashi et al. | |
| 5,383,211 A | 1/1995 | Van de Walle et al. | |
| 5,389,396 A | 2/1995 | Razeghi | |
| 5,432,812 A | 7/1995 | Kurobe et al. | |
| 5,436,194 A | 7/1995 | Kondo et al. | |
| 5,452,318 A | 9/1995 | Makino et al. | |
| 5,536,085 A | 7/1996 | Li et al. | |
| 5,606,570 A | 2/1997 | Botez et al. | |
| 5,727,013 A | 3/1998 | Botez et al. | |
| 5,734,670 A | 3/1998 | Ono et al. | |
| 5,793,787 A | 8/1998 | Meyer et al. | |
| 5,818,860 A | 10/1998 | Garbuzov et al. | |
| 5,889,805 A | 3/1999 | Botez et al. | |
| 5,953,356 A | 9/1999 | Botez et al. | |
| 6,028,874 A | 2/2000 | Wada et al. | |
| 6,028,875 A | 2/2000 | Knight et al. | |
| 6,127,691 A | 10/2000 | Fukunaga et al. | |
| 6,167,073 A | 12/2000 | Botez et al. | |
| 6,195,381 B1 | 2/2001 | Botez et al. | |
| 6,219,365 B1 | 4/2001 | Mawst et al. | |
| 6,256,330 B1 | 7/2001 | LaComb | |
| 6,298,077 B1 | 10/2001 | He | |
| 6,330,265 B1 | 12/2001 | Kinoshita | |
| 6,363,092 B1 | 3/2002 | Botez et al. | |
| 6,396,865 B1 | 5/2002 | Mawst et al. | |
| 6,621,842 B1 | 9/2003 | Dapkus | |
| 6,791,104 B2 | 9/2004 | Tansu et al. | |
| 6,810,053 B1 | 10/2004 | Botez et al. | |
| 6,849,866 B2 | 2/2005 | Taylor | |
| 6,907,056 B2 | 6/2005 | Botez | |
| 7,058,112 B2 * | 6/2006 | Johnson | 372/96 |
| 2001/0050934 A1 * | 12/2001 | Choquette et al. | 372/43 |
| 2002/0018501 A1 * | 2/2002 | Hatakoshi et al. | 372/43 |
| 2004/0061102 A1 | 4/2004 | Tansu | |
| 2005/0173694 A1 | 8/2005 | Mawst et al. | |
| 2005/0226296 A1 | 10/2005 | Botez et al. | |

FOREIGN PATENT DOCUMENTS

| | | |
|---|---|---|
| WO | WO 01/29943 | 4/2001 |

OTHER PUBLICATIONS

H. Kogelnik, et al., "Coupled-Wave Theory of Distributed Feedback Lasers," J. Appl. Phys., vol. 43, No. 5, May 1972, pp. 2327-2335.

H. C. Casey, Jr., "Temperature dependence of threshold current density on InP-$Ga_{0.28}In_{0.72}As_{0.6}P_{0.4}$ (1.3 µm) double heterostructure lasers," J. Appl. Phys., vol. 56(7), 1984, pp. 1959-1964.

C.H. Henry, et al., "Observation of Destructive Interference in the Radiation Loss of Second-Order Distributed Feedback Lasers," IEEE J. of Quantum Electronics, vol. QE-21, No. 2, Feb. 1985, pp. 151-153.

G. Ji, et al., "Band Lineup in $GaAs_{1-x}Sb_x$/GaAs Strained-Layer Multiple Quantum Wells Grown by Molecular-Beam Epitaxy," Physical Review B, vol. 38, No. 15, Nov. 15, 1988, pp. 10571-10577.

C.G. Van de Walle, "Band Lineups and Deformation Potentials in the Model-Solid Theory," Physical Review B., vol. 39, No. 3, Jan. 15, 1989, pp. 1871-1883.

D. Botez, et al., "Resonant Optical Transmission and Coupling in Phase-Locked Waveguide Array," Appl. Phys. Lett. 54(22), May 29, 1989, pp. 2183-2185.

D. Botez, et al., "Diffraction-Limited In-Phase-Mode Operation from Uniform Array of Antiguides with Enhanced Interelement Loss," Elec. Lett. 25(19), Sep. 14, 1989, pp. 1282-1283.

D. Ahn, et al., "Opical Gain and Gain Suppression of quantum-Well Lasers with Valence Band Mixing," IEEE Journal of Quantum Electronics, vol. 26, No. 1, Jan. 1990, pp. 13-24.

D. Botez, et al., "Phase-Locked Arrays of Antiguides: Modal Content and Discrimination," IEEE J. of Quantum Electronics, vol. 26, No. 3, Mar. 1990, pp. 482-495.

J. Kinoshita, "Axial Profile of Grating Coupled Radiation from Second-Order DFB Lasers with Phase Shifts," IEEE Journal of Quantum Electronics, vol. 26, No. 3, Mar. 1990, pp. 407-412.

S. H. Macomber, "Nonlinear Analysis of Surface-Emitting Distributed Feedback Lasers," IEEE Journal of Quantum Electronics, vol. 26, No. 12, Dec. 1990, pp. 2065-2074.

N.W. Carlson, et al., "Mode Discrimination in Distributed Feedback Grating Surface Emitting Lasers Containing a Buried Second-Order Grating," IEEE Journal of Quantum Electronics, vol. 27, No. 6, Jun. 1991, pp. 1746-1752.

D. Botez, "High-Power Monolithic Phase-Locked Arrays of Antiguided Semiconductor Diode Lasers," IEEE Proc.-J., vol. 139, No. 1, Feb. 1992, pp. 14-23.

K. David, et al., "Basic Analysis of AR-Coated, Partly Gain-Coupled DFB Lasers: The Standing Wave Effect," IEEE J. of Quantum Electronics, vol. QE-28, No. 2, Feb. 1992, pp. 427-433.

S. Kawanaka, et al., "Strained Single Quantum Well AlGainP Laser Diodes with an Asymmetric Waveguiding Layer," International Conference on Solid State Devices and Materials, Aug. 1, 1992, pp. 240-242.

Mawst, L.J., et al., "Design Optimization of ARROW-Type Diode Lasers," IEEE Photonics Technology Letters, vol. 4, No. 11, Nov. 1992, pp. 1204-1206.

S. F. Yu, et al., "Effect of External Reflectors on Radiation Profile of Grating Coupled Surface Emitting Lasers," IEE Proceedings J. Optoelectronics, GB, Institution of Electrical Engineers, Stevenage, vol. 140, No. 1, Feb. 1, 1993, pp. 30-38.

Y. Zou, et al., "Experimental Study of Auger Recombination, Gain, and Temperature Sensitivity of 1.5 µm Compressively Strained Semiconductor Lasers," IEEE Journal of Quantum Electronics, vol. 29, No. 6, Jun. 1993, pp. 1565-1575.

R.G. Baets, et al., "On the Distinctive Features of Gain Coupled DFB Lasers and DFB Lasers with Second Order Grating," IEEE J. of Quantum Electronics, vol. 29, No. 6, Jun. 1993, pp. 1792-1798.

D. Mehuys, et al., "5.25-W CW Near-Diffraction-Limited Tapered-Stripe Semiconductor Optical Amplifier," IEEE Photonics Technology Letters, vol. 5, No. 10, Oct. 1993, pp. 1179-1182.

D. Botez, et al., "Flat-Phasefront Fanout-Type Power Amplifier Employing Resonant-Optical-Waveguide Structures," Appl. Phys. Lett., vol. 63, No. 23, Dec. 6, 1993, pp. 3113-3115.

S. Ramanujan, et al., "Temporal Behavior of Resonant-Optical-Waveguide Phase-Locked Diode Laser Arrays," Appl. Phys. Lett., vol. 64, No. 7, Feb. 1994, pp. 827-829.

T. Namegaya, et al., "Effects of Well Number in 1.3 µm GaInAsP/InP GRIN-SCH Strained-Layer Quantum-Well Lasers," IEEE Journal of Quantum Electronics, vol. 30, No. 3, Feb. 1994, pp. 578-584.

Faist, J. et al., "Quantum Cascade Laser," *Science*, vol. 264, pp. 553-556, Apr. 22, 1994.

CLEO/IQEC'94 Advance Program, p. 52, Abstract entitled "Uniform near-field flat-phase-front antiguided power amplifier with a three-core Arrow master oscillator," distributed prior to May 8, 1994.

E.R. Youngdale, et al., "Auger Lifetime Enhancement in $InAs-Ga_{1-x}In_xSb$ Superlattices," Appl. Phys. Lett., vol. 64, No. 23, Jun. 6, 1994, pp. 3160-3162.

Zmudzinski, C., et al., Three-Core Arrow-Type Diode Laser: Novel High-Power, Single-Mode Device, and Effective Master Oscillator for Flared Antiguided MOPAs, Technical Digest CLEO-Europe Conference, Paper CTuP3 Amsterdam, Netherlands, Aug.-Sep. 1994, pp. 169-170.

Capasso, F. et al., Conf. Dig. 14th IEEE International Semiconductor Laser Conference, pp. 71-72, Maui, Hi., Sep. 19-23, 1994.

D. P. Bour, et al., "Tensile-Strained AlGaAsP- and InGaAsP-$(AlGa)_{0.5}In_{0.5}P$ Quantum Well Laser Diodes for TM-Mode Emission in the Wavelength Range 650 < Λ < 850 nm," IEEE Photonics Technology letters, vol. 6, No. 11, Nov. 1994, pp. 1283-1285.

Mawst, L.J., et al., "Above-Threshold Behavior of High-Power, Single-Mode Antiresonant Reflecting Optical Waveguide Diode Lasers," Appl. Phys. Lett., vol. 66, No. 1, Jan. 2, 1995, pp. 7-9.

Faist, J. et al., "Vertical Transition quantum Cascade Laser with Bragg Confined Excited State," *Appl. Phys. Lett.*, 66, pp. 538-540, Jan. 30, 1995.

Botez, D., et al., "Phase-Locked Arrays of Antiguides: Analytical Theory II," IEEE Journal Quantum Electronics, vol. 31, No. 2, Feb. 1995, pp. 244-253.

M. Sagawa, et al., "High-Power Highly-Reliable Operation of 0.98-µm InGaAs-InGaP Strain-Compensated Single-Quantum-Well Lasers with Tensile Strained InGaAsP Barriers," IEEE Journal of Selected Topics in Quantum Electronics, vol. 1. No. 2, Jun. 1995, pp. 189-195.

J.R. Meyer, et al., "Type-II Quantum-Well Lasers for the Mid-Wavelength Infrared," Appl. Phys. Lett., vol. 67, No. 6, Aug. 7, 1995, pp. 757-759.

Golster, I.V., "Single-Cladding Antiresonant Reflecting Optical Waveguide-Type Diode Laser," Optics Lett., vol. 20, No. 21, Nov. 1, 1995, pp. 2219-2221.

D.I. Babić, et al., "Room-Temperature Continuous-Wave Operation of 1.54 µm Vertical-Cavity Lasers," IEEE Photonics Technology Letters, vol. 7, No. 11, Nov. 1995, pp. 1225-1227.

Lelong, I.O., et al., "A Pulsed High-Power Quantum Well Laser using an Asymmetric Waveguide," Semiconductor Science and Technology, vol. 11, No. 4, Apr. 1, 1996, pp. 568-570.

Faist, J. et al., "Room Temperature mid-infrared quantum cascade lasers," *Electron. Lett.*, vol. 32, pp. 560-561, Mar. 14, 1996.

J.I. Malin, et al., "Type II Mid-Infrared Quantum Well Lasers," App. Phys. Lett., vol. 68, No. 21, May 20, 1996, pp. 2976-2978.

T. Fukunaga, et al., "Reliable Operation of Strain-Compensated 1.06 µm InGaAs/InGaAsP/GaAs Single Quantum Well Lasers," Appl. Phys. Lett., vol. 69, No. 2, Jul. 8, 1996, pp. 248-250.

G.L. Belenky, et al., "Effect of p-Doping Profile on Performance of Strained Multi-Quantum-Well InGaAsP-InP Lasers," IEEE Journal of Quantum Electronics, vol. 32, No. 8, Aug. 1996, pp. 1450-1455.

D. Botez, et al., "66% CW wallplug efficiency from Al-free 0.98 µm-emitting diode lasers," Electronics Letters, vol. 32, No. 21, Oct. 10, 1996, pp. 2012-2013.

M. Kasraian, et al., "Metal-grating-outcoupled, surface emitting distributed-feedback diode lasers," Appl. Phys. Lett., vol. 69, No. 19, Nov. 4, 1996, pp. 2795-2797.

H. Yi, et al., "Optical losses of Al-free lasers for □=0.808 and 0.98 □m," Appl. Phys. Lett., vol. 69, No. 20, Nov. 11, 1996, pp. 2983-2985.

Faist, J. et al., "Continuous wave quantum cascade lasers in the 4-10 µm wavelength region," *SPIE*, vol. 2682, San Jose, pp. 198-204, 1996.

D. Bimberg, et al., "InGaAs-GaAs Quantum-Dot Lasers," IEEE Journal of Selected Topics in Quantum Electronics, vol. 3, No. 2, Apr. 1997, pp. 196-205.

O'Brien, S., et al., "2.2-W Continuous-Wave Diffraction-Limited Monolithically Integrated Master Oscillator Power Amplifier at 854 nm," IEEE Photonics Technology Letters, vol. 9, No. 4, Apr. 1, 1997, pp. 440-442.

Buda, M., et al., "Analysis of 6-nm AlGaAs SQW Low-Confinement Laser Structures for very High-Power Operation," IEEE Journal of Selected Topics in Quantum Electronics, vol. 3, No. 2, Apr. 1997, pp. 173-179.

B. Xu, et al., "Grating Coupling for Intersubband Emission," Applied Physics Letters, US, American Institute of Physics, New York, vol. 70, No. 19, May 12, 1997, pp. 2511-2513.

Choquette, K. D., "Advanced in Selective Wet Oxidation of AlGaAs Alloys," IEEE Journal of Selected Topics in Quantum Electronics, vol. 3, No. 3, Jun. 1997, pp. 916-925.

M. Kondow, et al., "GaInNAs: A Novel Material for Long-Wavelength Semiconductor Lasers," IEEE Journal of Selected Topiocs in Quantum Electronics, vol. 3, No. 3, Jun. 1997, pp. 719-730.

A. Al-Muhanna, et al., "780 nm-emitting Al-Free Active Region Diode Lasers with Compressively-Strained InGaAsP Quantum Wells," Conference Proceedings, LEOS '97, Nov. 10-13, 1997, pp. 201-202.

M.A. Emanuel, et al., "High-Power InAlGaAs-GaAs Laser Diode Emitting Near 731 nm," IEEE Photonics Technology Letters, vol. 9, No. 11, Nov. 1997, pp. 1451-1453.

J. Lopez, et al., "Uniform near-field, symmetric-mode surface emission from complex-coupled $2^{nd}$-order distributed-feedback lasers," Conference Proceedings, Leos '97, $10^{th}$ Annual Meeting, IEEE Lasers and Electro-Optics Society 1997 Annual Meeting, vol. 1, pp. 9-10.

S.H. Macomber, et al., "Curved-Grating, Surface-Emitting DFB Lasers and Arrays," Proc. SPIE, vol. 3001, No. 42, 1997, pp. 42-54.

P.D. Floyd, et al., "Low-Threshold Laterally Oxidized GaInP-AlGaInP Quantum-Well Laser Diodes," IEEE Photonics Technology Letters, vol. 10, No. 1, Jan. 1, 1998, pp. 45-57.

A. Al-Muhanna, et al., "730-nm-Emitting Al-Free Active-Region Diode Letters with Compressively Strained InGaAsP Quantum Wells," Applied Physics Letters, vol. 72, No. 6, Feb. 9, 1998, pp. 641-643.

S. Sato, et al., "Metalorganic Chemical Vapor Deposition of GaIn-NAs Lattice Matched to GaAs for Long-Wavelength Laser Diodes," Journal of Crystal Growth, vol. 192, Nos. ¾, Sep. 1998, pp. 381-385.

Sirtori, C. et al., "Resonant Tunneling in Quantum Cascade Laser Structures," *IEEE J. Quantum Electron.*, vol. 34, Sep. 1998, pp. 1722-1729.

A. Al-Muhanna, et al., "High-Performance, Reliable, 730 nm-Emitting Al-Free Active Region Diode Lasers," 1998 IEEE $16^{th}$ International Semiconductor Laser Conference, Nara, Japan, Oct. 4-8, 1998, Conference Digest, pp. 139-140.

J. Lopez, et al., "Surface-emitting, distributed-feedback diode lasers with uniform near-field intensity profile," Applied Physics Letters, vol. 73, No. 16, Oct. 19, 1998, pp. 2266-2268.

T. Anan, et al., "GaAsSb: A Novel Material for 1.3 µm VCSELs," Electronics Letters, vol. 34, No. 22, Oct. 29, 1998, pp. 2127-2129.

D.L. Huffaker, et al., "1.3 µm Room-Temperature Gaas-Based Quantum-Dot Laser," Applied Physics Letters, vol. 73, No. 18, Nov. 2, 1998, pp. 2564-2565.

J.R. Meyer, et al., "Auger Coefficients in Type-II InAs/$Ga_{1-x}In_x$Sb Quantum Wells," Applied Physics Letters, vol. 73, No. 20, Nov. 16, 1998, pp. 2857-2859.

Gmachl, C. et al., "Non-Cascaded Intersubband Injection Lasers at $\lambda=7.7$ µm," *Appl. Phys. Lett.*, vol. 73, No. 26, Dec. 28, 1998, pp. 3830-3832.

F. Hohnsdorf, et al., "Reduced Threshold Current Densities of (GaIn)(NAs)/GaAs Single Quantum Well Lasers for Emission Wavelengths in the Range of 1.28-1.38 µm" Electronics Letters, vol. 35, No. 7, Apr. 1, 1999, pp. 571-572.

P. Bhattacharya, et al., "In(Ga)As/GaAs Self-Organized Quantum Dot Lasers: DC and Small-Signal Modulation Properties," IEEE Transactions on Electron Devices, vol. 46, No. 5, May 1999, pp. 871-883.

D. Kwon, et al., "Deep Levels in P-Type InGaAsN Lattice Matched to GaAs," Applied Physics Letters, vol. 74, No. 19, May 10, 1999, pp. 2830-2832.

A. F. Phillips, et al., "Temperature Dependence of 1.3- and 1.5-µm Compressively Strained InGaAs(P) MQW Semiconductor Lasers," IEEE. J. Select. Topics Quantum Electron., vol. 5, No. 3, May/Jun. 1999, pp. 401-412.

S. Sato, et al., "Room-Temperature Continuous-Wave Operation of 1.24 µm GaInNAs Lasers Grown by Metal-Organic Chemical Vapor Deposition" IEEE Journal of Selected Topics in Quantum Electronics, vol. 5, No. 3, May/Jun. 1999, pp. 707-710.

J. Boucart, et al., "1-mW CW-RT Monolithic VCSEL at 1.55 µm," IEEE Photonics Technology Letters, vol. 11, No. 6, Jun. 1999, pp. 629-631.

F. Koyama, et al., "1.2 µm Highly Strained GaInAs/GaAs Quantum Well Lasers for Singlemode Fibre Datalink," Electronics Letters, vol. 35, No. 13, Jun. 24, 1999, pp. 1079-1081.

J. Lopez, et al., "Single-mode, single-lobe operation of surface-emitting, second-order distributed feedback lasers," Applied Physics Letters, AIP, USA, vol. 75, No. 7, Aug. 16, 1999, pp. 885-887.

D. Schlenker, et al., "1.17-µm highly strained GaInAs-GaAs quantum-well laser," IEEE Photon. Technol. Lett., vol. 11(8), Aug. 1999, pp. 946-948.

P. Dowd, et al., "Long Wavelength (1.3 and 1.5 µm) Photoluminescense fromInGaAs/GaPAsSb Quantum Wells Grown on GaAs," Applied Physics Letters, vol. 75, No. 9, Aug. 30, 1999, pp. 1267-1269.

S. Sato, et al., "1.21 µm Continuous-Wave Operation of Highly Strained GaInAs Quantum Well Lasers on GaAs Substrates," Jpn. J. Appl. Phys., vol. 38, Sep. 15, 1999, pp. 990-992.

K. Mukai, et al., "1.3 µm CW Lasing of InGaAs-GaAs Quantum Dots at Room Temperature with a Threshold Current of 8 mA," IEEE Photonics Technology Letters, vol. 11, No. 10, Oct. 1999, pp. 1205-1207.

E.P. O'Reilly, et al., "k-P model of Ordered $GaN_xAs_{1-x}$," Physica Status Solidi (b), vol. 216, No. 1, Nov. 1, 1999, pp. 131-134.

W. Choi, et al., "1.2-µm GaAsP/InGaAs Strain Compensated Single-Quantum-Well Diode Laser on GaAs Using Metal-Organic Chemical Vapor Deposition," IEEE Photonics Technology Letters, vol. 11, No. 12, Dec. 1999, pp. 1572-1574.

M.R. Gokhale, et al., "Low-Threshold Current, High-Efficiency 1.3-µm Wavelength Aluminum-Free InGaAsN-Based Quantum-Well Lasers," IEEE Photonics Technology Letters, vol. 12, No. 2, Feb. 2000, pp. 131-133.

I.K. Han, et al., "Dependence of the Light-Current Characteristics of 1.55 □m Broad-Area Lasers on Different p-doping Profiles," IEEE Photonics Technology Letters, vol. 12, No. 3, Mar. 2000, pp. 251-253.

C.W. Coldren, et al., "1200 nm GaAs-Based Vertical Cavity Lasers Employing GaInNAs Multiquantum Well Active Regions," Electronics Letters, vol. 36, No. 11, May 25, 2000, pp. 951-952.

P. Bhattacharya, et al., "High-Speed Modulation and Switching Characteristics of In(Ga)As-Al(Ga)As Self-Organized Quantum-Dot Lasers," IEEE Journal of Selected Topics in Quantum Electronics, vol. 6, No. 3, May/Jun. 2000, pp. 426-438.

C.F. Hsu, et al., "Intersubband Quantum-Box Semiconductor Lasers," *IEEE J. Quantum Electron.*, vol. 6, May/Jun. 2000, pp. 491-503.

S. Sato, "Low Threshold and High Characterisics Temperature 1.3 µm Range GaInNAs Lasers Grown by Metalorganic Chemical Vapor Deposition," Jpn. J. Appl. Phys., vol. 39, Jun. 2000, pp. 3403-3405.

A. Stintz, et al., "Low-Threshold Current Density 1.3-µm InAs Quantum-Dot Lasers with the Dots-in-a-Well (DWELL) Structure," IEEE Photonics Technology Letters, vol. 12, No. 6, Jun. 2000, pp. 591-593.

B. Borchert, et al., "Static and Dynamic Characteristics of 1.29-µm GaInNAs Ridge-Waveguide Laser Diodes," IEEE Photonics Technology Letters, vol. 12, No. 6, Jun. 2000, pp. 597-599.

O. Blum, et al., "Characteristics of GaAsSb Single-Quantum-Well-Lasers Emitting Near 1.3 µm," IEEE Photonics Technology letters, vol. 12, No. 7, Jul. 2000, pp. 771-773.

M. Yamada, et al., "Low-Threshold Operation of 1.3-µm GaAsSb Quantum-Well Lasers Directly Grown on GaAs Substrates," IEEE Photonics Technology Letters, vol. 12, No. 7, Jul. 2000, pp. 774-776.

K.D. Choquette, et al., "Room Temperature Continuous Wave InGaAsN Quantum Well Vertical-Cavity Lasers Emitting at 1.3 µm," Electronics Letters, vol. 36, No. 16, Aug. 3, 2000, pp. 1388-1390.

S. Ryu, et al., "Low Threshold Current Density GaAsSb Quantum Well (QW) Lasers Grown by Metal Organic Chemical Vapour Deposition on GaAs Substrates," Electronic Letters, vol. 36, No. 16, Aug. 3, 2000, pp. 1387-1388.

E. Hall, et al., "Room-Temperature, CW Operation of Lattice-Matched Long-Wavelength VCSELs," Electronics Letters, vol. 36, No. 17, Aug. 17, 2000, pp. 1465-1467.

W. Braun, et al., "Strained InGaAs/GaPAsSb Heterostructures Grown on GaAs (001) for Optoelectronic Applications in the 1100-1550 nm Range," Journal of Applied Physics, vol. 88, No. 5, Sep. 1, 2000, pp. 3004-3014.

G. Liu, et al., "Optical Gain of Strained GaAsSb/GAAs Quantum-Well Lasers: A Self-Consistent Approach," Journal of Applied Physics, vol. 88, No. 10, Nov. 15, pp. 5554-5561.

J.S. Harris, Jr., "Tunable Long-Wavelength Vertical-Cavity Lasers: The Engine of Next Generation Optical Networks?" IEEE J. Select. Topics Quantum Electron., vol. 6, No. 6, Nov./Dec. 2000, pp. 1145-1160.

F. Quochi, et al., "Room Temperature Operation of GaAsSb/GaAs Quantum Well VCSELs at 1.29 µm," Electronics Letters, vol. 36, No. 25, Dec. 7, 2000, pp. 2075-2076.

Barbieri, S. et al. "Design Strategies for GaAs-based unipolar lasers: optimum injector-active region coupling via resonant tunneling," *Appl. Phys. Lett.*, vol. 78, Jan. 15, 2001, pp. 282-284.

R. Fehse, et al., "Insights into Carrier Recombination Processes in 1.3 µm GaInNAs-Based Semiconductor Lasers Attained Using High Pressure," Electronics Letters, vol. 37, No. 2, Jan. 18, 2001, pp. 92-93.

N. Tansu, et al., "High-Performance Strain-Compensated InGaAs-GaAsP-GaAs (λ=1.17 µm) Quantum-Well Diode Lasers," IEEE Photonics Technology Letters, vol. 13, No. 3, Mar. 2001, pp. 179-181.

M. O. Fischer, et al., "Room-temperature operation of GaInAsN-GaAs laser diodes in the 1.5-µm range," IEEE J. Select. Topic Quantum Electronic., vol. 7 (2), Mar.-Apr. 2001, pp. 149-151.

T. Anan, et al., "Continuous-Wave Operation of 1.30 µm GaAsSb/GAAS VCSELs," Electronics Letters, vol. 37, No. 9, Apr. 26, 2001, pp. 566-567.

Page, H. et al., "300 K operation of a GaAs-based quantum-cascade laser at λ≈9 µm," Appl. Phys. Lett., vol. 79, No. 22, May 28, 2001, pp. 3529-3531.

M. Kawaguchi, et al., "Lasing characteristics of low threshold GaInNAs lasers grown by Metalorganic Chemical vapor Deposition", Jpn. J. Appl. Phys., vol. 40, Jul. 2001, pp. 744-746.

W.W. Chow, et al., "Contributions to the Large Blue Emission Shift in a GaAsSb Type-II Laser," IEEE Journal of Quantum Electronics, vol. 37, No. 9, Sep. 9, 2001, pp. 1178-1182

S. Tomic, et al., "A Theoretical Analysis of the Radiative Current and its Dependence on pressure in GaInNAs 1.3 µm Lasers," IEEE LEOS 2001, San Diego, CA, Nov. 2001, pp. 328-329.

S.R. Kurtz, et al., "MOCVD-Grown, 1.3 µm InGaAsN Multiple Quantum Well Lasers Incorporating GAAsP Strain-Compensated Layers," Proceedings of SPIE, vol. 4287, 2001, pp. 170-175.

J. Wu, et al., "Effect of Band Anticrossing on the Optical Transitions in $GAAs_{1-x}N_x$/GaAs Multiple Quantum Wells," Physical Review B, vol. 64, 2001, pp. 1-4.

Beck, M. et al., "Continuous Wave Operation of a Mid-Infrared Semiconductor Laser at Room Temperautre," *Science*, vol. 295, pp. 301-305, Jan. 11, 2002.

W. Ha, et al., "High-Efficiency Multiple Quantum Well GaInNAs/GaNAs Ridge-Waveguide Diode Lasers," Proceedings of SPIE vol. 4651, Jan. 2002, pp. 42-48.

Yang, Q. K. et al., "Improvement of λ≈5 µm quantum cascade lasers by blocking barriers," *Appl. Phys. Lett.*, vol. 80, No. 12, Mar. 25, 2002, pp. 2048-2050.

N. Tansu, et al., "Low-Threshold Strain-Compensated InGaAs(N) (λ=1.19-1.31 µm) Quantum Well Lasers," IEEE Photon. Technol. Lett., vol. 14(4), Apr. 2002, pp. 444-446.

T. Takeuchi, et al., "Low threshold 1.2 µm InGaAs quantum well lasers grown under low As/III ratio," Appl. Phys. Lett., vol. 80(14), Apr. 8, 2002, pp. 2445-2447.

Sirtori, C. et al., "GaAs-AlGaAs Quantum Cascade Lasers: Physics, Technology and Prospects," *IEEE J. Quantum Electron.*, vol. 38, Jun. 2002, pp. 547-558.

N. Tansu, et al., "Temperature Analysis and Characteristics of Highly Strained InGaAs-GaAsP-GaAs (λ>1.17 µm) Quantum-Well Lasers," IEEE Transactions on Quantum Electronics, vol. 38, No. 6, Jun. 2002, pp. 640-651.

R. Fehse, et al., "A Quantitative Study of Radiative, Auger, and Defect Related Recombination Processes in 1.3-µm GaInNAs-Based Quantum-Well Lasers," IEEE Select. J. Quantum Electron., 8(4), 801, Jul./Aug. 2002.

V. Gambin, et al. "GaInNAsSb for 1.3-1.6 µm long wavelength lasers grown by MBE,"IEEE J. Quantum. Electron, vol. 8, Jul./Aug. 2002, pp. 795-800 or InGaAs-GaAsSb type-II QWs.

N. Tansu, et al., "Temperature Sensitivity of 1300-nm InGaAsN Quantum-Well Lasers," IEEE Photon. Technol. Lett., vol. 14(8), Aug. 2002, pp. 1052-1054.

J.J. Lee, et al., "Asymmetric Broad Waveguide Diode Lasers (□=980 nm) of Large Equivalent Transverse Spot Size and Low Temperature Sensitivity," IEEE Photonics Technology Letters, vol. 14, No. 8, Aug. 2002, pp. 1046-1048.

N. Tansu, et al., "Low-Threshold-Current-Density 1300-nm Dilute-Nitride Quantum Well Lasers," Appl. Phys. Lett, vol. 81 (14), Sep. 2002, pp. 2523-2525.

H. Cao, et al., "Characterization of MOCVD-grown InNAs/GaAS Quantum Wells", IEEE/OSA Conference on Lasers and ElectroOptics (CLEO), paper CFG2, 2002, p. 653.

T. Takeuchi, et al., "1.3 µm InGaAsN Vertical Cavity Surface Emitting Lasers Grown by MOCVD," Electronics Letters, vol. 38(23), Nov. 7, 2002, pp. 1438-1440.

N. Tansu, et al., "The Role of Hole-Leakage in 1300-nm InGaAsN Quantum Well Lasers," Appl. Phys. Lett., vol. 82(10), Mar. 2003, pp. 1500-1502.

N. Tansu, et al., "High-Performance and High-Temperature Continuous-Wave-Operation 1300-nm InGaAsN Quantum Well Lasers by Organometallic Vapor Phase Epitaxy," Appl. Phys. Lett., vol. 83(1), Jul. 2003, pp. 18-20.

N. Tansu, et al., "Experimental Evidence of Carrier Leakage in InGaAsN Quantum Well Lasers," Appl. Phys. Lett., vol. 83(11), Sep. 2003.

I. Vurgaftman, et al., "Band parameters for nitrogen-containing semiconductors," J. Appl. Phys. 94, 3675, Sep. 15, 2003.

N. Tansu, et al., "Design Analysis of 1550-nm GaAsSb-(In)GaAsN Type-II Quantum-Well Laser Active Regions," IEEE J. of Quantum Elec., vol. 39, No. 10, Oct. 2003, pp. 1205-1210.

I. Vurgaftman, et al., "(In) GaAsN-based type-II 'W' quantum-well lasers for emission at $\lambda=1.55$ µm," Appl. Phys. Lett., vol. 83, No. 14, Oct. 6, 2003, pp. 2742-2744.

Xu, D.P., et al., "Room-temperature, mid-infrared ($\lambda=4.7$ µm) electroluminescence from single-stage intersubband GaAs-based edge emitters," Tech. Digest 2004 CLEO/IQEC Conference, paper CMR2, San Francisco, Ca., May 16-21, 2004.

Xu, D.P., et al., "Room-temperature, mid-infrared ($\lambda=4.7$ µm) electroluminescence from single-stage intersubband GaAs-based edge emitters," *Appl. Phys. Lett.*, vol. 85, No. 20, Nov. 15, 2004, pp. 1-3.

Botez, D. et al., "Intersubband Quantum-Box Semiconductor Lasers," Proc. International Workshop on Quantum Cascade Lasers, Jan. 4-8, 2004, Seville, Spain.

* cited by examiner

QUANTUM WELL LASERS WITH STRAINED QUANTUM WELLS AND DILUTE NITRIDE BARRIERS

STATEMENT OF GOVERNMENT RIGHTS

This invention was made with United States Government support awarded by the following agencies: Department of Defense ARPA under grant number DAAD19-03-1-0367, and National Science Foundation under grant number NSF 0355442. The United States has certain rights in this invention.

FIELD OF THE INVENTION

The present invention relates generally to the field of GaAs-based optoelectronic devices such as light emitting diodes and semiconductor diode lasers incorporating highly strained quantum wells with dilute nitride barriers.

BACKGROUND OF THE INVENTION

Conventional 1300 nm lasers are based on the InGaAsP or InGaAlAs quantum-well (QW) active material system on an InP substrate. Unfortunately, these 1300 nm InP-based diode lasers suffer poor lasing performance at high-temperature operation. (See, Belenky et al, IEEE J. Quantum Electron, vol. 35, pp. 1515, 1999.) The InGaAsN material system has also been introduced as a material system with enormous potential for realizing light emitters on GaAs in the wavelength regime of interest for optical communications, namely 1300-1550. (See, M. Kondow et al., IEEE J. Sel. Top. Quantum Electron, vol. 3, pp. 719, 1997.) The poor temperature characteristics InGaAsN QW lasers, (see, for example, Kondow et al., IEEE J. Sel. Top. Quantum Electron. vol. 3, pp. 719, 1997; Harris Jr., IEEE J. Sel. Top. Quantum Electron. vol. 6, pp. 1145, 2000; and Sato, Jpn. J. Appl. Phys. Part 1 vol. 39, pp. 3403, 2000) as well as other types of 1300 nm active regions on GaAs, as alternatives to realize high-performance QW lasers for high-temperature operation.

Unfortunately, early InGaAsN QW lasers suffer from poor lasing performance due to the utilization of nearly lattice-matched InGaAsN. (See, Kondow et al., IEEE J. Sel. Top. Quantum Electron. vol. 3, pp. 719, 1997 and Harris Jr., IEEE J. Sel. Top. Quantum Electron. vol. 6, pp. 1145, 2000.) The nearly lattice-matched or lattice-matched InGaAsN QW lasers require a relatively large N content of approximately 3% with an In content of 9%-12% to adjust the lattice constant back to that of an unstrained material system. The utilization of a high In-content InGaAsN QW active region has been proposed. (See, Sato, Jpn. J. Appl. Phys., Part 1 vol. 39, pp. 3403, 2000.) The concept proposed was to utilize as high an In content as possible in the InGaAsN QW, such that a minimum amount of N content is required to push the peak emission wavelength to 1300 nm. By utilizing this approach, 1300 nm InGaAsN QW lasers with reasonable threshold current densities, on the order of 0.92-1.0 kA/cm$^2$ for devices with a cavity length of approximately 1000 μm have been achieved. Recently, various groups utilizing an In content as high as 30%-40% have been able to realize high-performance InGaAsN QW lasers in the wavelength regime of 1280-1310 nm. (See, for example, Sato, Jpn. J. Appl. Phys., Part 1 vol. 39, pp. 3404, 2000; Livshits et al., Electron. Lett. vol. 36, pp. 1381, 2000; and Tansu et al., IEEE Photonics Technol. Lett. vol. 14, pp. 444, 2000.)

InGaAsN QW lasers with an In content of 40% and N content of only 0.5% have been realized with threshold current densities of only 210 A/cm$^2$ at an emission wavelength of 1295 nm. (See, Tansu et al., Appl. Phys. Lett. vol. 81, pp. 2523, 2002.) From studies on InGaAsN QW lasers with an In content of 35%-43%, a trend toward a reduction in the threshold current densities for 1300 nm InGaAsN QW lasers with increasing In content has been observed. Therefore, it is extremely important to realize high-performance InGaAs QW lasers with a very long emission wavelength, such that it requires a minimal amount of N in the QW to push the emission wavelength to 1300 nm.

InGaAs QW lasers with an emission wavelength beyond 1230 nm, utilizing GaAsP tensile-strained buffer and barrier layers have also been realized with threshold current densities of only 90 A/cm$^2$. (See, Tansu, et al., Appl. Phys. Lett. vol. 82, pp. 4038 2003.) In these lasers, a tensile-strained GaAsP buffer layer acts to partially strain compensate for the QW growth template leading to an improved optical quality for the highly strained InGaAs(N) QW.

Unfortunately, the use of nitrogen in the quantum wells of the InGaAsN QW lasers decreases the quality of the semiconductor crystal, increasing the risk of device failure.

SUMMARY OF THE INVENTION

In accordance with the present invention, GaAs-based optoelectronic devices have an active region that includes a well layer composed of a compressively-strained semiconductor that is free, or substantially free, of nitrogen disposed between two barrier layers composed of a nitrogen- and indium-containing semiconductor. The present optoelectronic devices are capable of generating light at relatively long wavelengths, e.g., 1.3 μm or higher.

In a preferred embodiment, the active region includes a layer of compressively-strained InGaAs disposed between a pair of InGaAsN barrier layers. The InGaAsN barrier layers may be disposed between a pair of GaAsP tensile-strained barrier layers. In some embodiments, the GaAsP tensile-strained barrier layers are directly adjacent to the InGaAsN barrier layer. In other embodiments, the optoelectronic devices may include a GaAs spacer layer between the InGaAsN barrier layers and the GaAsP tensile-strained barrier layers.

The device preferably includes an active region with multiple well layers in order to increase the optical gain of the device. In such a multiple well layer device, each well layer is disposed between a pair of barriers layers (as well as any optional spacer layers). The resulting active region may be disposed between tensile-strained barrier layers.

The nitrogen containing barrier layers are dilute nitrogen layers, typically having a nitrogen content of no more than about 3%. Depending on the nitrogen content of the barrier layers in the active region, the quantum wells of the active regions may have a type I or a type II structure.

In the devices of the invention, the semiconductor layers that make up the quantum well, barrier, tensile-strained barrier and spacer layers may be epitaxially deposited on a substrate of GaAs using conventional deposition techniques, such as molecular beam epitaxy (MBE) or metal organic chemical vapor deposition (MOCVD).

The present invention may be embodied in various types of optoelectronic devices including amplifiers, light emitting diodes, and edge emitting and surface emitting lasers which incorporate optical feedback to provide lasing action.

Further objects, features and advantages of the invention will be apparent from the following detailed description when taken in conjunction with the accompanying drawings.

DETAILED DESCRIPTION OF THE INVENTION

The present invention provides high-performance optoelectronic devices with an emission wavelength of 1200 nm, or higher, utilizing nitrogen-free (or substantially nitrogen-free) well layers with dilute nitride barrier layers. Tensile-strained barrier layers disposed beyond the dilute nitride barrier layers are desirably included to provide strain compensation to the compressively-strained InGaAs quantum wells. Spacer layers may separate the tensile-strained barrier layers from the dilute nitride barrier layers. These spacer layers may be used to achieve longer wavelength emission and/or to suppress diffusion between the tensile-strained barrier layers and the dilute nitride barrier layers.

For the purposes of this disclosure a well layer is "substantially free of nitrogen" as long as any nitrogen present in the layer is due only to diffusion between the well layer and a neighboring semiconductor layer. Thus, the term "substantially free of nitrogen" is intended to account for the fact that in practice it may be difficult (or impossible) to prevent some nitrogen from diffusing into the well layer during, for example, an annealing step, even when the well layer is initially deposited without nitrogen. Similarly, for the purposes of this disclosure, a semiconductor layer that is said to include (or comprise) a particular element, such as nitrogen or indium, is a semiconductor layer that is initially formed with that element (as distinguished from a semiconductor layer that includes that element only by virtue of the diffusion of that element from a neighboring semiconductor layer).

Figure 1:
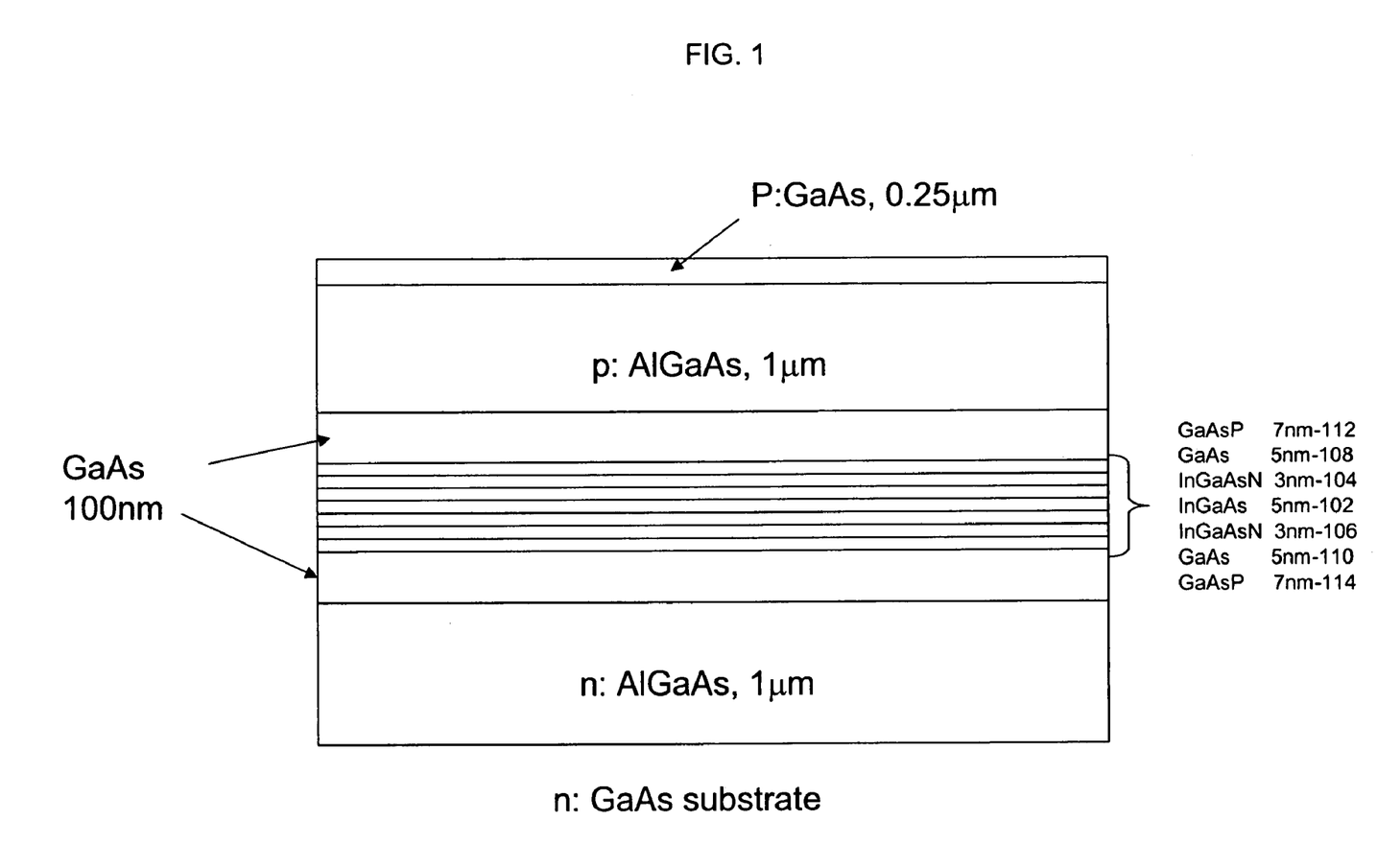
FIG. 1 shows a cross-sectional view through a multiple semiconductor layer structure of the single stage of a type I quantum well laser in accordance with the present invention.

The present active regions represent an improvement over more conventional InGaAsN quantum well optoelectronic devices because the elimination of nitrogen from the well layer provides devices with improved crystal quality in the well layer, resulting in improved device performance and reduced risk of device failure. The inclusion of low levels of nitrogen in the dilute nitride barrier layers reduces the quantum size effect for carriers in the quantum well, and results in an extension of emission wavelength. Depending upon the nitrogen content in the dilute nitride barrier layers, the quantum wells of the active region may have a Type I or a Type II band alignment. As the nitrogen content in the dilute nitride barrier layers increases, the quantum wells undergo a transition from a Type I alignment to a Type II alignment due to the reduction of the bandgap for the dilute nitride semiconductor (e.g., InGaAsN). For the quantum wells that include a InGaAs well layer and $InGaAsN_x$ dilute nitride barrier layers, as shown in FIG. 1 (discussed below), the quantum well adopts a type I configuration when x is less than about 0.8%. For higher N contents, the quantum well adopts a type II configuration.

With reference to the drawings, FIG. 1 shows a cross-sectional view through a multiple semiconductor layer structure (including typical compositions and thicknesses for each layer) that may be incorporated into an optoelectronic device in accordance with the present invention. In the illustrative embodiment shown in FIG. 1, an InGaAs well layer 102 is sandwiched between a pair of InGaAsN barrier layers 104, 106. GaAs spacer layers 108, 110 are disposed adjacent to each InGaAsN barrier layer 104, 106. GaAsP tensile-strained barrier layers 112, 114 are disposed adjacent to each GaAs spacer layer, opposite barrier layers 104, 106.

Figure 2:
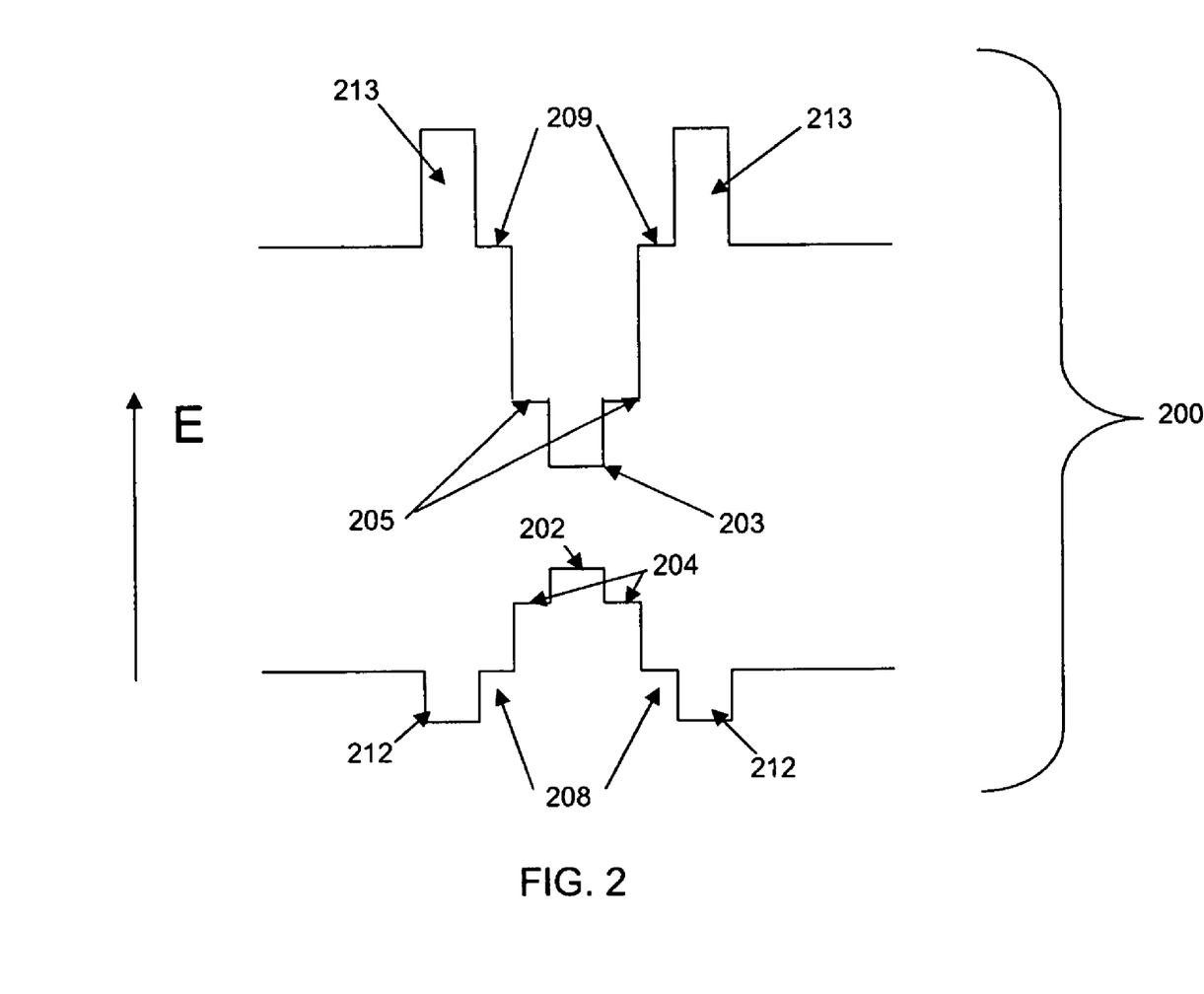
FIG. 2 is an energy band diagram for the single stage of the multiple stage quantum well laser of FIG. 1 having a type I quantum well structure.

FIG. 2 shows a schematic energy band diagram 200 for the multiple semiconductor layer structure of FIG. 1. Each layer in the structure of FIG. 1 has an associated valance band and conduction band. InGaAs (e.g., $In_{0.45}Ga_{0.55}As$) well layer 102 has valance band 202 and conduction band 203; InGaAsN (e.g., $In_{0.2}Ga_{0.8}As_{0.993}N_{0.007}$) barrier layers 104, 106 have valence bands 204 and conduction bands 205; GaAs spacer layers 108, 110 have valance bands 208 and conduction bands 209; and GaAsP (e.g., $GaAs_{0.85}P_{0.15}$) tensile-strained barrier layers 112, 114 have valence bands 212 and conduction bands 213. As shown in FIG. 1, the quantum wells in the embodiment have a Type I band alignment.

Figure 3:
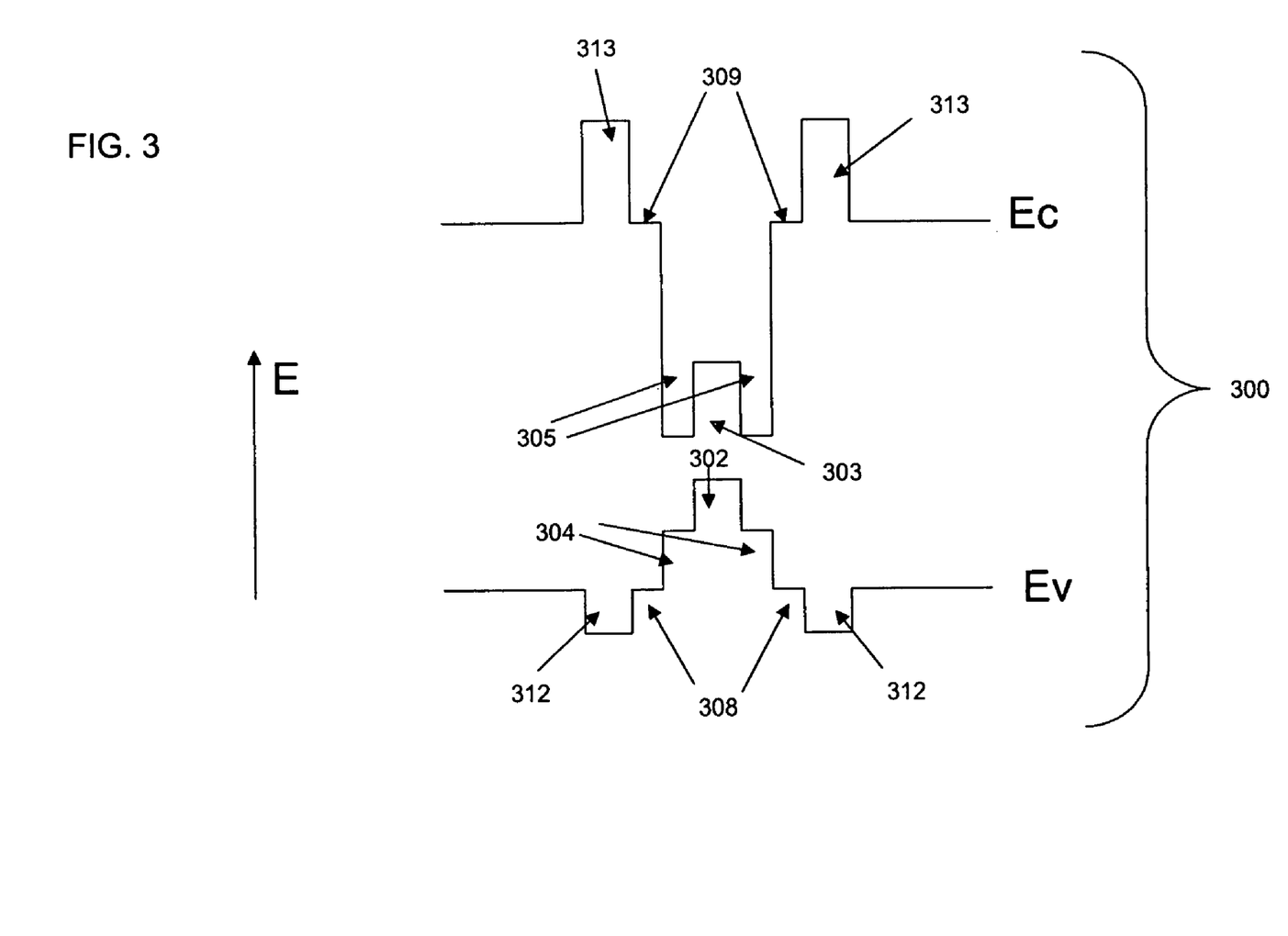
FIG. 3 is an energy band diagram for the single stage of a multiple stage quantum well laser, in accordance with this invention, having a type II quantum well structure.

FIG. 3 shows a schematic energy band diagram 300 for the multiple semiconductor layer structure made from the semiconductor materials shown in FIG. 1, but with a higher nitrogen content in the dilute nitride barrier layers. As shown in the figure, the InGaAs (e.g., $In_{0.45}Ga_{0.55}As$) well layer has valance band 302 and conduction band 303; InGaAsN (e.g., $In_{0.2}Ga_{0.8}As_{0.98}N_{0.02}$) layers have valence bands 304 and conduction bands 305; GaAs spacer layers have valance bands 308 and conduction bands 309; and GaAsP (e.g., $GaAs_{0.85}P_{0.15}$) tensile-strained barrier layers have valence bands 312 and conduction bands 313. As shown in FIG. 3, the quantum wells in the embodiment have a Type II band alignment due to the increased nitrogen content in the dilute nitride barrier layers. In this structure, the InGaAs layer provides a hole quantum well and the InGaAsN layers provide electron quantum wells.

All of the multiple semiconductor layer structures described herein may be fabricated by metal organic chemical vapor deposition (MOCVD) using suitable precursors. Examples of suitable Group III precursors include trimethylgallium, trimethylaluminum and trimethylindium. Examples of suitable Group V precursors include $AsH_3$ and $PH_3$. $SiH_4$ and diethylzinc may be used as n- and p-dopants, respectively. The fabrication of the semiconductor layers is desirably carried out under conditions that minimize or eliminate the diffusion of elements between the layers. For example, this may be accomplished by operating below temperatures at which diffusion occurs.

Figure 4:
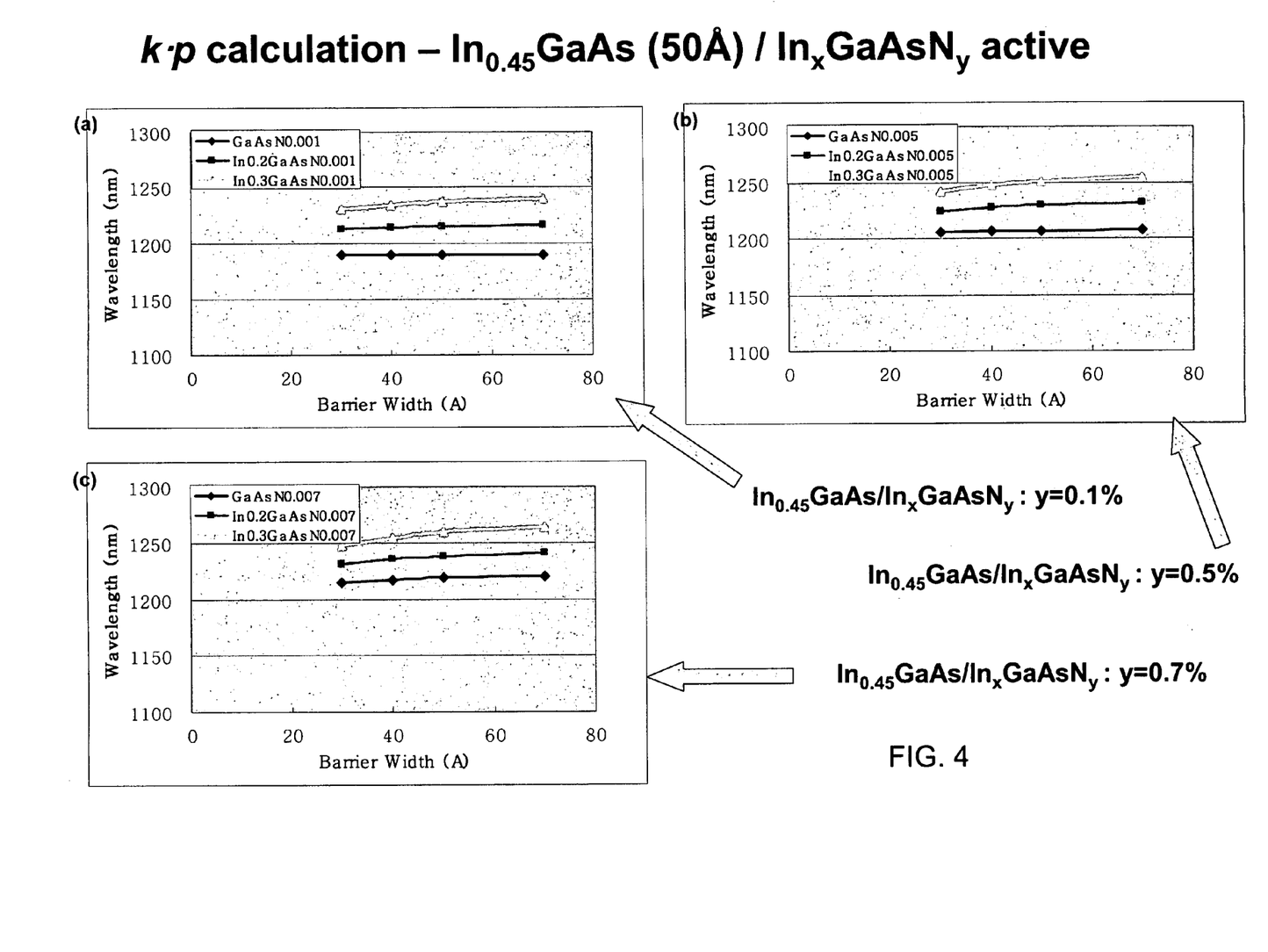
FIGS. 4a-4c are graphs showing the k·p calculated emission wavelength for a 50 Å thick active region comprising an $In_{0.45}GaAs$ well layer flanked by InGaAsN tensile-strained barrier layers of various thicknesses having various indium and nitrogen contents.

FIGS. 4a-4c are graphs showing the calculated emission wavelength for a 50 Å thick active region comprising an $In_{0.45}GaAs$ well layer flanked by InGaAsN tensile-strained barriers layers of various thicknesses having various indium and nitrogen contents. As shown in FIGS. 4a-4c, the emission wavelength generally increases with increasing nitrogen content in the InGaAsN barrier layer. The emission wavelength also increases with increasing indium content in the InGaAsN barrier layer. The emission wavelength calculations shown in FIG. 4 are carried out with a 10-band k·p simulation. As shown in FIGS. 4a-4c, various compositions and thicknesses of the InGaAsN barrier layers can be used with the 50 Å thick InGaAs QWs to achieve an emission wavelength of at least about 1.25 µm.

The multiple semiconductor layer structures described above may be incorporated in various semiconductor optoelectronic device structures, including light emitting diodes, laser diodes, amplifiers, gain sections for external cavity lasers, modulators, and photodetectors. For purposes of illustrating the application of the invention, an example of a surface emitting laser structure is discussed below.

Figure 5:
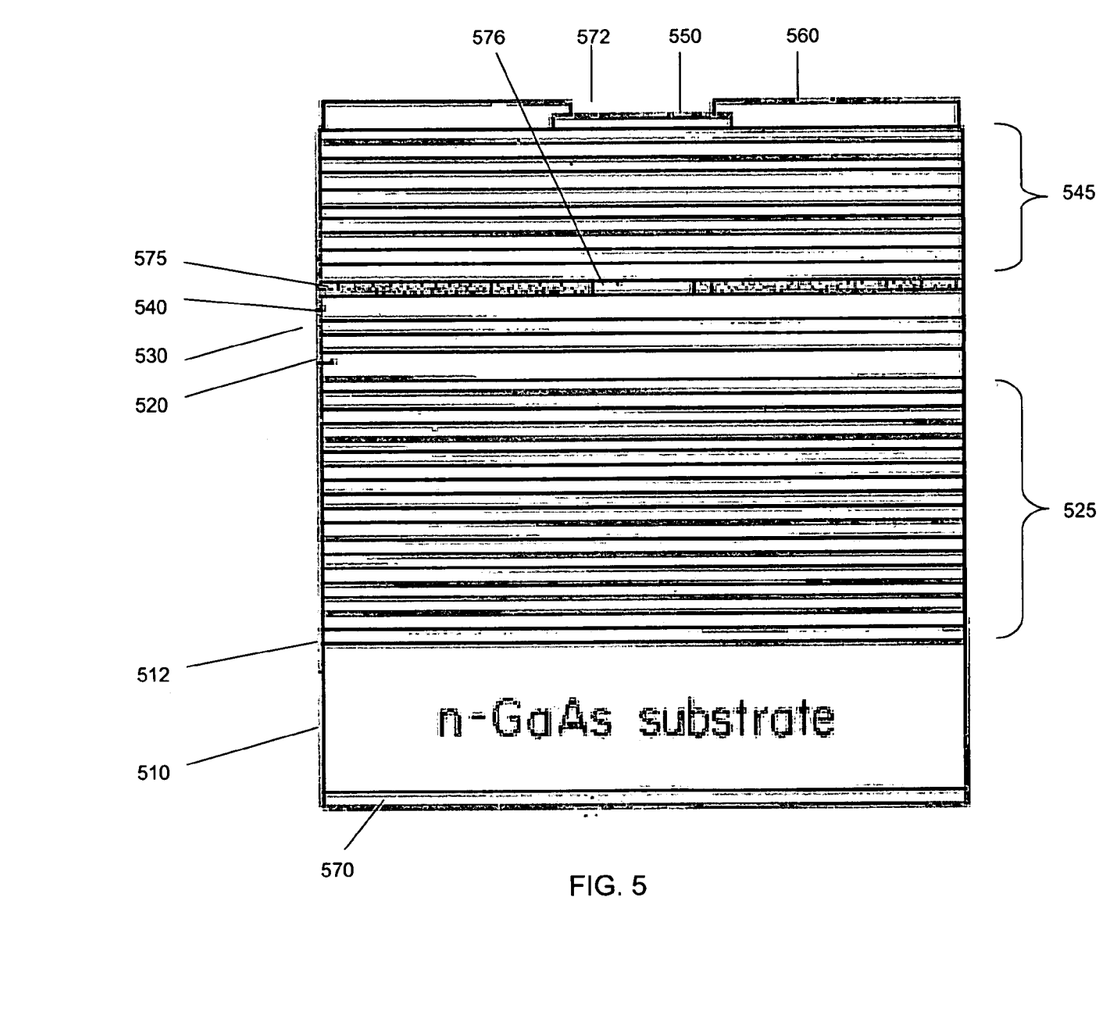
FIG. 5 is a schematic cross-sectional view of a quantum well laser in accordance with this invention embodied in a vertical cavity surface emitting laser (VCSEL).

FIG. 5 is a schematic cross-sectional view of an example of the present invention embodied in a vertical cavity surface emitting laser (VCSEL) 500. The VCSEL includes a substrate 510 of n-doped GaAs, a lower confinement layer 520 (of, e.g., GaAs or AlGaAs), an active region layer 530 having a multiple quantum well structure comprising InGaAs well layers, InGaAsN barrier layers and, optionally, GaAsP tensile-barrier layers, as described above, an upper confinement layer 540 (of, e.g., GaAs or AlGaAs) and a capping layer 550 of, e.g., p+-doped GaAs. An upper distributed Bragg reflector (DBR) 545, formed, e.g., of multiple (e.g., 22) alternating layers of AlGaAs/GaAs, and a lower DBR 525 formed, e.g., of multiple (e.g., 40) alternating layers of AlAs/GaAs, provide optical feedback of light in the vertical direction to provide lasing action in the active region. Electrode layers 560 and 570 are formed on the top and bottom surfaces of the structure, respectively, of metal (e.g., Ti/Pt/Al) to provide electrical contacts by which voltage may be applied to the VCSEL to generate lasing in the active region. An aperture or opening 572 is formed in the electrode layer 560 through which a light beam may be emitted. A layer of AlAs/Al$_2$O$_3$ 575 with an opening 576 therein interposed between the upper confinement layer 540 and the upper DBR 545 to confine current flow through the opening 576 and provide light generation in the active region under the opening. The top surface 512 of the substrate 510 may be oriented in a (100) crystallographic direction, and the various layers formed above the substrate 510 can be epitaxially grown thereon in a conventional fashion. According to alternative embodiments, other crystallographic directions for the top surface 512 and subsequent layers may be used. The epitaxially-grown layers may be provided above the substrate 510 using metal organic chemical vapor deposition (MOCVD) or molecular beam epitaxy (MBE).

Implementation of InGaAs/InGaAsN active regions into vertical cavity surface emitting lasers (VCSELs), allows for production of monolithic, lower cost, longer wavelength (e.g., 1.2 to 1.55 µm or longer, etc.) sources, as compared with conventional lasers.

Figure 6:
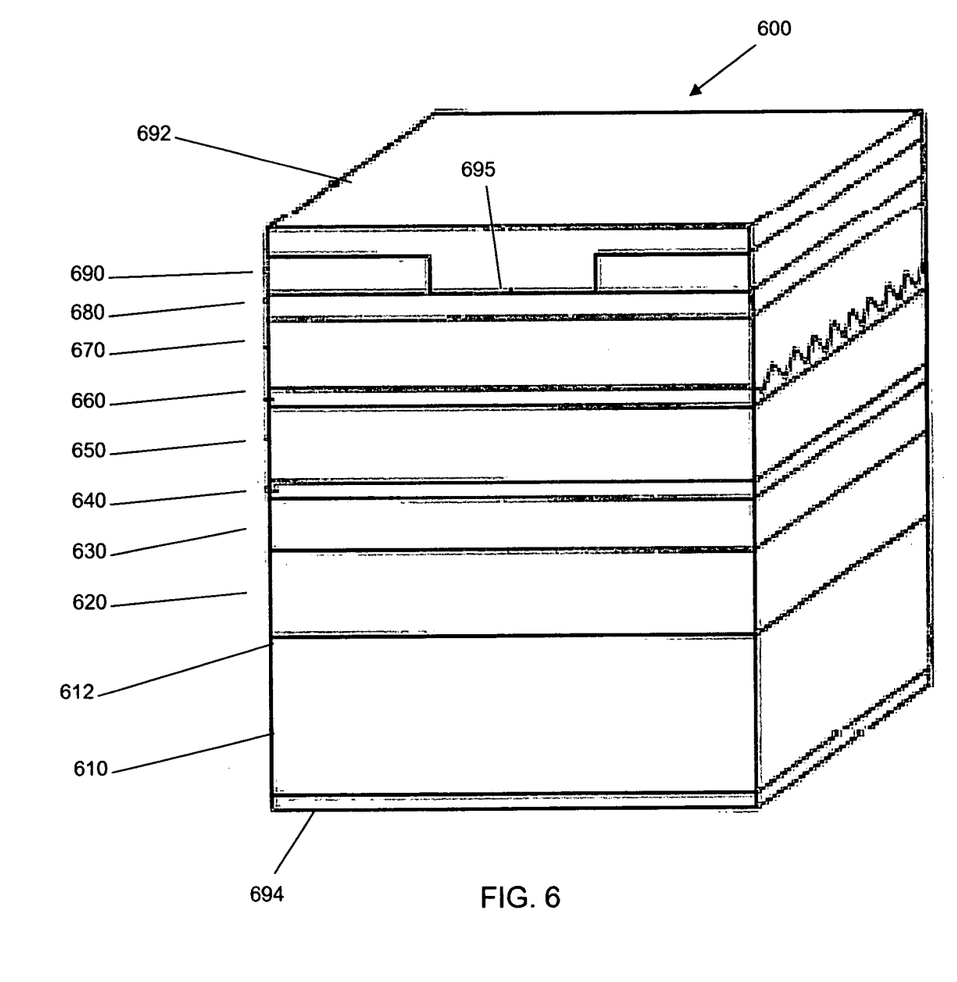
FIG. 6 is a schematic diagram of an edge-emitting laser in accordance with another exemplary embodiment of the invention.

The invention may also be embodied in edge emitting lasers. For purposes of illustration, FIG. 6 shows a schematic diagram of a distributed feedback edge-emitting laser 600 fabricated in accordance with another exemplary embodiment. The laser 600 includes a substrate 610 of n-doped GaAs, a lower cladding layer 620 (e.g., n-doped AlGaAs or n-doped InGaP), a lower optical confinement layer 630 (e.g., GaAs), an active region 640 having a multiple quantum well structure as discussed above, an upper confinement layer 650 (e.g., GaAs), a distributed feedback grating 660 (DFB) formed in the upper confinement layer, an upper cladding layer 670 (e.g., p-AlGaAs or p-InGaP), a capping layer 680 (e.g., p-doped GaAs), an insulating layer 690 (e.g., silicon dioxide), and electrode layers 692 and 694 preferably formed of a metal to provide electrical contacts through which voltage may be applied to generate light in the active region 640. Although a distributed feedback grating 660 is illustrated for purposes of providing grated feedback, the present invention may be embodied in lasers having mirrored and semi-mirrored edge facets as discussed below. Lateral current confinement may be provided utilizing an opening 695 in the insulating layer 690 through which current can flow from the electrode 692. However, other types of gain guiding and/or lateral confinement may be utilized. The top surface 612 of the substrate 610 may be oriented in a (100) crystallographic direction, and the various layers formed above the substrate 610 may be epitaxially grown thereon. According to alternative embodiments, other crystallographic directions for the top surface 612 and subsequent layers may be used. The epitaxially-grown layers may be provided above the substrate 610 using metal organic chemical vapor deposition (MOCVD) or molecular beam epitaxy (MBE).

The active region 640 includes a multiple QW structure having, e.g., 3 QW stages, for a total of 6 layers. A different number of stages or layers may be used in an active region. For example, ten layers may be used to form an active region having five QW stages. The thickness and composition of each of the layers included in the active region 640 may be chosen based on the factors discussed above.

Figure 7:
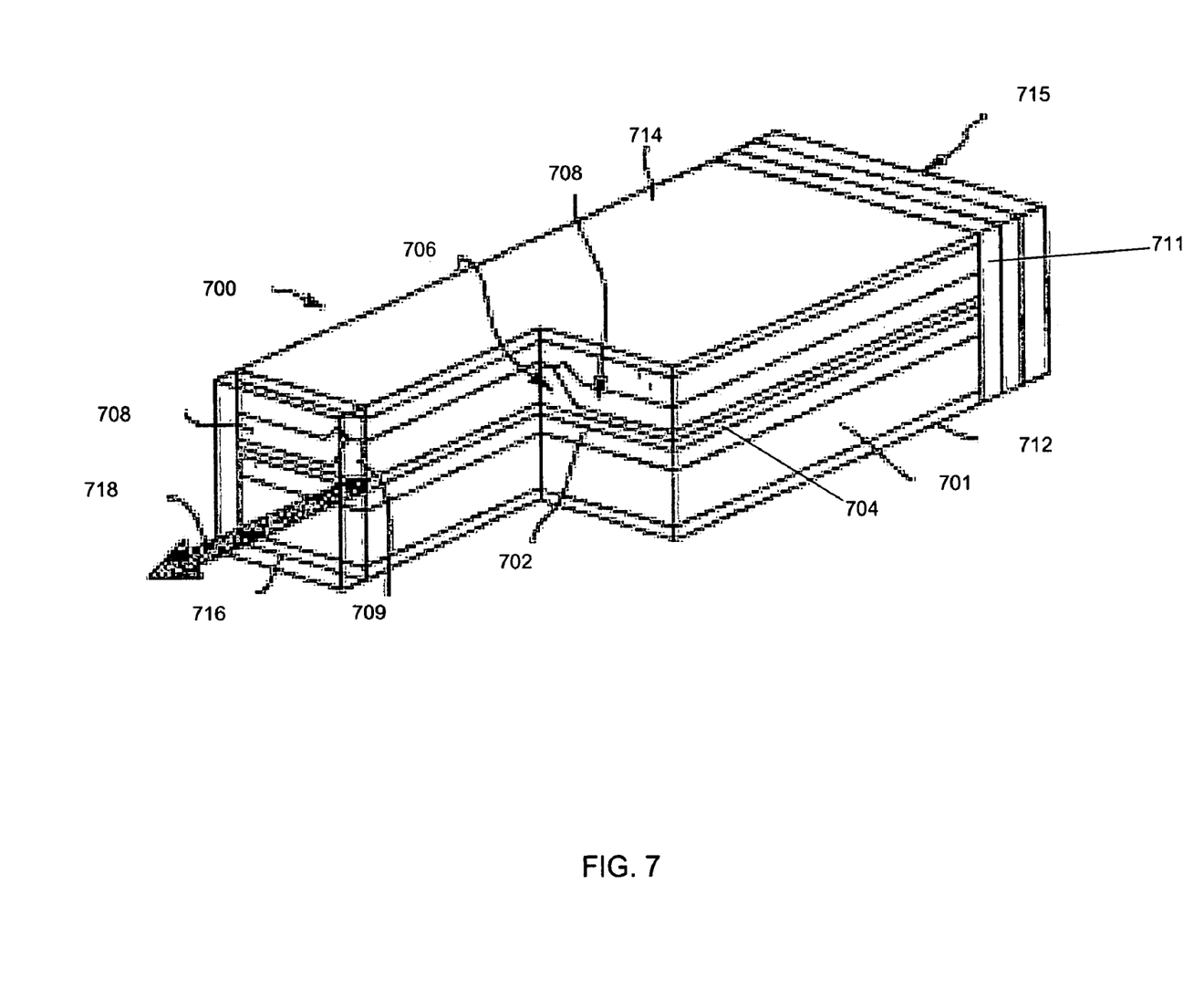
FIG. 7 is a schematic diagram of another embodiment of an edge-emitting laser in accordance with the invention.

An example of an edge emitting Fabry-Perot laser design incorporating the present invention is illustrated generally at 700 in FIG. 7. The laser 700 includes a substrate 701 of GaAs, generally n-doped, an n-doped cladding layer 702 (e.g., AlGaAs or InGaP), a strained multiple quantum well-single confinement heterostructure (MQW-SCH) active region layer 704 in accordance with the invention, an upper p-type cladding layer 706 (e.g., AlGaAs or InGaP), an n-GaAs blocking layer 708 with a central opening 709 therein (e.g., p-AlGaAs), and a cap layer 711 (e.g., p-GaAs). A layer of metal 712 on the bottom surface of the substrate 701 provides the lower electrode, and a layer of metal 714 on the top surface of the cap layer 711 provides the upper electrode. When voltage is applied between the upper electrode 714 and the lower electrode 712, current flows in the opening 709 in the blocking layer 708, with current being blocked elsewhere by the n-p junction provided by the blocking layer 708 and the p-type cladding layer 706. Optical feedback to provide lasing action in the active region is provided by a high reflection coating mirror 715 at one of the edge facets and a lower reflection coating 716 at the other edge facet which provides partial reflection and allows a beam of light 718 to exit from the edge facet of the laser.

It should be understood that the invention is not limited to the embodiments set forth herein as illustrative, but embraces all such forms thereof as come within the scope of the following claims.

What is claimed is:

1. A GaAs-based multiple semiconductor layer structure for an optoelectronic device comprising an active region comprising at least one quantum well, the quantum well comprising a well layer disposed between two dilute nitride semiconductor layers, wherein the well layer comprises a compressively-strained semiconductor comprising indium and being substantially free of nitrogen and the two dilute nitride semiconductor layers comprise indium and nitrogen.

2. The multiple semiconductor layer structure of claim 1, wherein the well layer is a InGaAs layer and the two dilute nitride semiconductor layers are InGaAsN layers.

3. The multiple semiconductor layer structure of claim 2, wherein the two InGaAsN layers are disposed between two tensilely-strained GaAsP barrier layers.

4. The multiple semiconductor layer structure of claim 3, further comprising a GaAs spacer layer disposed between each InGaAsN layer and each GaAsP barrier layer.

5. The multiple semiconductor layer structure of claim 2, wherein the InGaAs well layer and the InGaAsN layers form a type I quantum well.

6. The multiple semiconductor layer structure of claim 3, wherein the InGaAs well layer, the InGaAsN layers, and the tensilely-strained GaAsP barrier layers form a type II quantum well.

7. The multiple semiconductor structure of claim 1, wherein the active region comprises multiple adjacent quantum wells.

8. A vertical cavity surface emitting laser comprising:
(a) a GaAs substrate;
(b) a first mirror disposed above the substrate;
(c) the active region of claim 1, disposed above the first mirror;
(d) a layer defining an opening disposed above the active region;
(e) a second mirror disposed above the layer defining the opening;
(f) a first electrode disposed below the substrate; and
(g) a second electrode defining an opening disposed above the second mirror.

9. The vertical cavity surface emitting laser of claim 8, further comprising a lower confinement layer disposed between the active region and the lower mirror and an upper confinement layer disposed between the active region and the layer defining an opening.

10. A distributed feedback edge emitting laser comprising:
(a) a GaAs substrate;
(b) the active region of claim 1 disposed above the substrate;
(c) a distributed feedback grating disposed above the active region;
(d) a first electrode disposed below the substrate; and
(e) a second electrode disposed above the distributed feedback grating.

11. The distributed feedback edge emitting laser of claim 10, further comprising a lower confinement layer disposed between the active region and the substrate and an upper confinement layer disposed between the active region and the second electrode, wherein the distributed feedback grating is formed in the upper confinement layer.

12. The distributed feedback edge emitting laser of claim 11, further comprising a lower cladding layer disposed between the lower confinement layer and the substrate and an upper cladding layer disposed between the distributed feedback grating and the second electrode.

13. An edge emitting Fabry Perot laser comprising:
(a) a GaAs substrate;
(b) the active region of claim 1 disposed above the substrate;
(c) a blocking layer defining an opening disposed above the active region;
(d) a first electrode disposed below the substrate;
(e) a second electrode disposed above the blocking layer;
(f) a first mirror disposed at a first edge facet of the active region; and
(g) a second mirror disposed at a second edge facet of the active region, opposite the first mirror, wherein the second mirror allows partial reflection of light generated in the active region.

14. The edge emitting Fabry Perot laser of claim 13, further comprising a lower cladding layer disposed between the active region and the substrate and an upper cladding layer disposed between the active region and the blocking layer.

15. A method for forming the GaAs-based multiple semiconductor layer structure of claim 1, the method comprising forming at least one quantum well by:
(a) depositing a first dilute nitride semiconductor layer over a GaAs substrate, the dilute nitride semiconductor comprising indium and nitrogen;
(b) depositing a well layer comprising a layer of a semiconductor comprising indium and being substantially free of nitrogen over the first dilute nitride semiconductor layer; and
(c) depositing a second dilute nitride semiconductor layer over the layer of a semiconductor comprising indium and being substantially free of nitrogen.

16. The method of claim 15, wherein the well layer is a InGaAs layer and the first and second dilute nitride semiconductor layers are InGaAsN layers.

17. The method of claim 16, further comprising depositing a first GaAsP layer over the substrate prior to the deposition of the first InGaAsN layer and depositing a second GaAsP layer over the second InGaAsN layer.

18. The method of claim 17, further comprising depositing a first GaAs layer over the first GaAsP layer prior to the deposition of the first InGaAsN layer and depositing a second GaAs layer over the second InGaAsN layer prior to depositing the second GaAsP layer.

19. The method of claim 16, wherein the InGaAs layer and the first and second InGaAsN layers form a type I quantum well.

20. The method of claim 17, wherein the InGaAs layer, the first and second InGaAsN layers and the first and second GaAsP layers form a type II quantum well.

* * * * *